United States Patent
Barrou et al.

[11] Patent Number: 5,912,478
[45] Date of Patent: Jun. 15, 1999

[54] AVALANCHE PHOTODIODE

[75] Inventors: Thomas Barrou, Cachan; André Scavennec, Paris, both of France

[73] Assignee: France Telecom, Paris, France

[21] Appl. No.: 08/980,106

[22] Filed: Nov. 26, 1997

[30] Foreign Application Priority Data

Nov. 27, 1996 [FR] France .................... 95 14521

[51] Int. Cl.⁶ .................... H01L 31/0328
[52] U.S. Cl. .................... 257/185; 257/186; 257/191; 257/21; 257/438
[58] Field of Search .................... 257/21, 22, 185, 257/186, 190, 191, 438

[56] References Cited

U.S. PATENT DOCUMENTS 5,539,221  7/1996  Tsuji et al. .................... 257/186

OTHER PUBLICATIONS

Le Bellego Y et al., AlInAs/GaInAs Sagm–APD, Third International Conference. Indium Phosphide and Related Materials, Cardiff, UK, Apr. 8–11, 1991, pp. 452–455.

Hanatani S Et al., Flip–Chip Inalas/Ingaas Superlattice Avalanche Photodiodes with Back–Illuminated Structures, Microwave and Optical Technology Letters, vol. 7, No. 3, Feb. 20, 1994, pp. 103–107.

Toshiaki Kagawa et al., Ingaasp–Inalas Superlattice Avalanche Photodiode, IEEE Journal of Quantum Electronic, vol. 28, No. 6, Jun. 1, 1992, p. 1420.

Watanabe I et al., High–Speed and Low–Dark–Current Flip–Chip Inalas/Inalgaas Quaternary Well Superlattice Apd's with 120 GHZ Gain–Bandwidth Product, IEEE Photonics Technology Letters, vol. 5, No. 6, Jun. 1, 1993, pp. 675–677.

*Primary Examiner*—Minh Loan Tran
*Attorney, Agent, or Firm*—Blakely Sokoloff Taylor & Zafman

[57] ABSTRACT

An avalanche photodiode having an absorption zone, a multiplication zone, and a transition zone disposed between the absorption zone and the multiplication zone, the transition zone being doped and being constituted at least in part by a material of composition that is graded such that the energy bands of the structure are substantially continuous when it is biased, wherein said doping is distributed non-uniformly in said graded composition zone so as to compensate, at least in part, the reverse electric field due to the composition grading of the material in the transition zone.

9 Claims, 2 Drawing Sheets

AVALANCHE PHOTODIODE

The present invention relates to avalanche photodiodes, and particularly, but in non-limiting manner, to avalanche photodiodes made of III–V semiconductor materials.

BACKGROUND OF THE INVENTION

Avalanche photodiodes make it possible to obtain light sensors that have high sensitivity and high speed, e.g. for optical fiber transmission applications.

An avalanche photodiode comprises two main zones:

- an absorption zone for absorbing photons, which zone is made of a material and has a thickness that depend respectively on the wavelength to be detected and on the speed of operation that is to be obtained; this zone is characterized by a relatively small forbidden energy band, in particular for applications at 1.5 µm, and it is generally subjected to a moderate electric field; and
- a multiplication zone which enables internal gain to be obtained by means of the avalanche phenomenon; this zone can be of various compositions (uniform material or multilayer structure) and of various thicknesses, and it is subjected to an electric field that is very high.

To separate the high electric field zone from the moderate field zone, it is common practice to provide an intermediate or transition zone between these two zones.

In the specific case of GaInAs/InP avalanche photodiodes, intended for photodetection in the 1.3 µm to 1.6 µm range, it is impossible to make the GaInAs material of the absorption zone operate at the high fields required for the InP material of the multiplication zone, so it is essential for these two zones to be separated.

By way of example, the transition zone can be constituted by a layer of InP or of AlInAs that is uniformly doped in order to obtain the field breakdown electric charge that enables a moderate electric field in the absorption zone to coexist with a strong field in the avalanche zone.

Avalanche photodiodes of this type (generally referred to as "Separate Absorption and Multiplication" or "SAM" avalanche photodiodes) are described, in particular, in the following publications:

[1] T. Kagawa, Y. Kawamura and H. Iwamura: "InGaAsP-InAlAs superlattice avalanche photodiode", IEEE Journal of Quantum Electronics, Vol. 28, No. 6, pp. 1419–1423, June 1992;

[2] I. Watanabe, S. Sugou, H. Ishikawa, T. Anan, K. Makita, M. Tsuji and K. Tagushi: "High-speed and low dark current flip-chip InAlAs/InAlGaAs quaternary well superlattice APD's with 120 GHz gain-bandwidth product", IEEE Photonics Technology Letters, Vol. 5, No. 6, pp. 675–677, June 1993; and

[3] S. Hanatani, H. Nakamura, S. Tanaka and T. Ido: "Flip-chip InAlAs/InGaAs superlattice avalanche photodiodes with back illuminated structures", Microwave and Optical Technology Letters, Vol. 7, No. 3, pp. 103–107, Feb. 20, 1994.

Nevertheless, as can be seen in FIG. 1, such photodiodes suffer from discontinuities (of several tens of meV) in their conduction and valence bands on either side of the transition zone. This can give rise, in particular, to the carriers generated by photon absorption being captured or to ionization by impact, and it is harmful for photodiode performance since the ideal transport of carriers at high speed is disturbed. This effect is even more perceptible at low temperature.

More recently, avalanche photodiode structures have been proposed in which the transition zone has one or more layers of GaInAsP forming something which is misleadingly called a "gradual" or "graded" transition zone, and such photodiodes are said to be of the "Separate Absorption, Grading, and Multiplication" (SAGM) type.

This concept has been taken up and discussed in:

[4] Y. Le Bellego: "Photodiodes AlInAs/GaInAs pour transmissions optiques: composants passivés à grande sensibilité et large bande passante", [AlInAs/GaInAs photodiodes for optical transmission: passivated components having high sensitivity and large passband], thesis at Caen University, 1991, with photodiodes in which the avalanche zone is made of a multiple quantum well AlInAs/GaInAs material, with the absorption zone being made of GaInAs.

Because of the high ratio between the coefficients $\alpha$ and $\beta$ for ionization by electrons and by holes ($\alpha/\beta \approx 10$), such photodiodes having a multiple quantum well avalanche zone are capable of presenting particularly satisfactory performance (high gain-bandwidth product) providing fields are available in the absorption region and in the multiplication region that are very uniform and well controlled.

In such structures, the passage of electrons from the absorption zone to the avalanche zone takes place via a transition zone comprising a first region of non-doped quaternary material of graded composition, and a second region of fixed composition (AlInAs) having uniform p+ doping (Be doping). In a variant, grading can also be internal to the doped region.

Such a transition zone makes continuous energy bands possible, with the level of doping in said transition zone determining field distribution in the photodiode.

Nevertheless, it suffers from the drawback firstly of not being very compact, and secondly of leading to reverse electric fields opposing the passage of carriers from one zone to the other.

OBJECTS AND SUMMARY OF THE INVENTION

An object of the invention is thus to propose a photodiode structure that is more compact. Another object of the invention is to propose a novel avalanche photodiode structure in which the transition zone makes it possible simultaneously:

to obtain excellent separation between the electric field levels on either side of the transition zone; and to obtain conduction and valance bands that facilitate the passage of carriers from one to the other of the zones adjacent to said transition zone.

To this end, the invention provides an avalanche photodiode having an absorption zone, a multiplication zone, and a transition zone disposed between the absorption zone and the multiplication zone, the transition zone being doped and being constituted at least in part by a material of composition that is graded such that the energy bands of the structure are substantially continuous when it is biased, wherein said doping is distributed non-uniformly in said graded composition zone so as to compensate, at least in part, the reverse electric field due to the composition grading of the material in the transition zone.

For example, most of the charge is situated on a portion of the graded composition zone beside the avalanche zone.

Advantageously, the transition zone also further includes, beside the absorption zone, a doping plane that has the function of slowing down extension of the space charge zone.

BRIEF DESCRIPTION OF THE DRAWINGS

Other characteristics and advantages of the invention appear further from the following description. The description is purely illustrative and non-limiting. It should be read with reference to the accompanying drawings, in which.

MORE DETAILED DESCRIPTION

Figure 1:
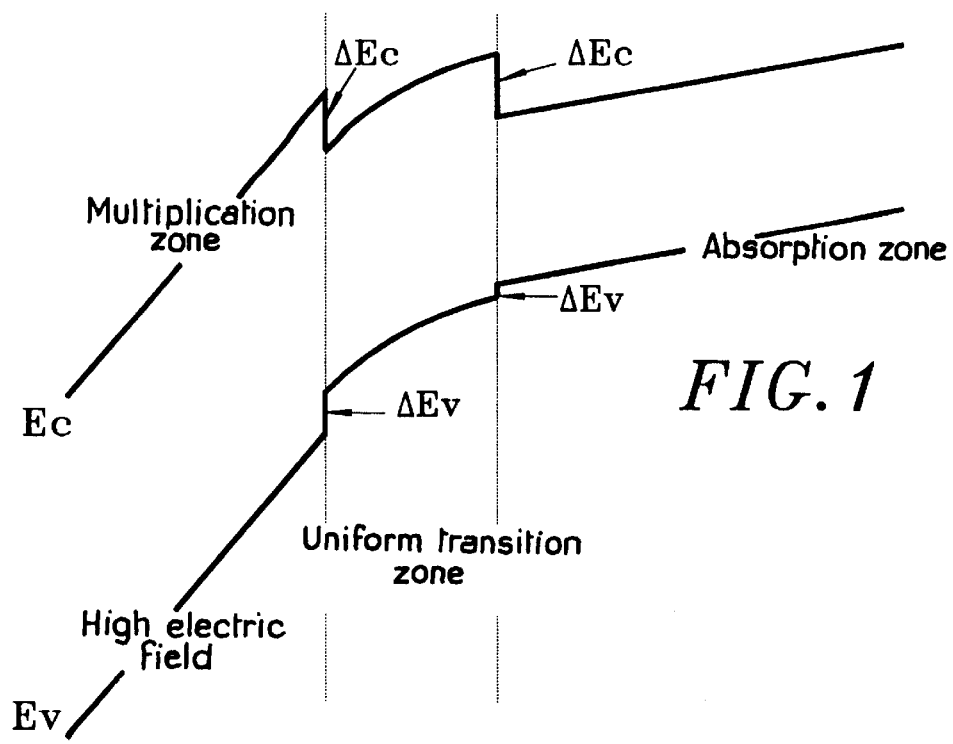
FIG. 1, described above, shows the energy levels of the conduction and valence bands for a photodiode structure of the SAM type.
Figure 2:
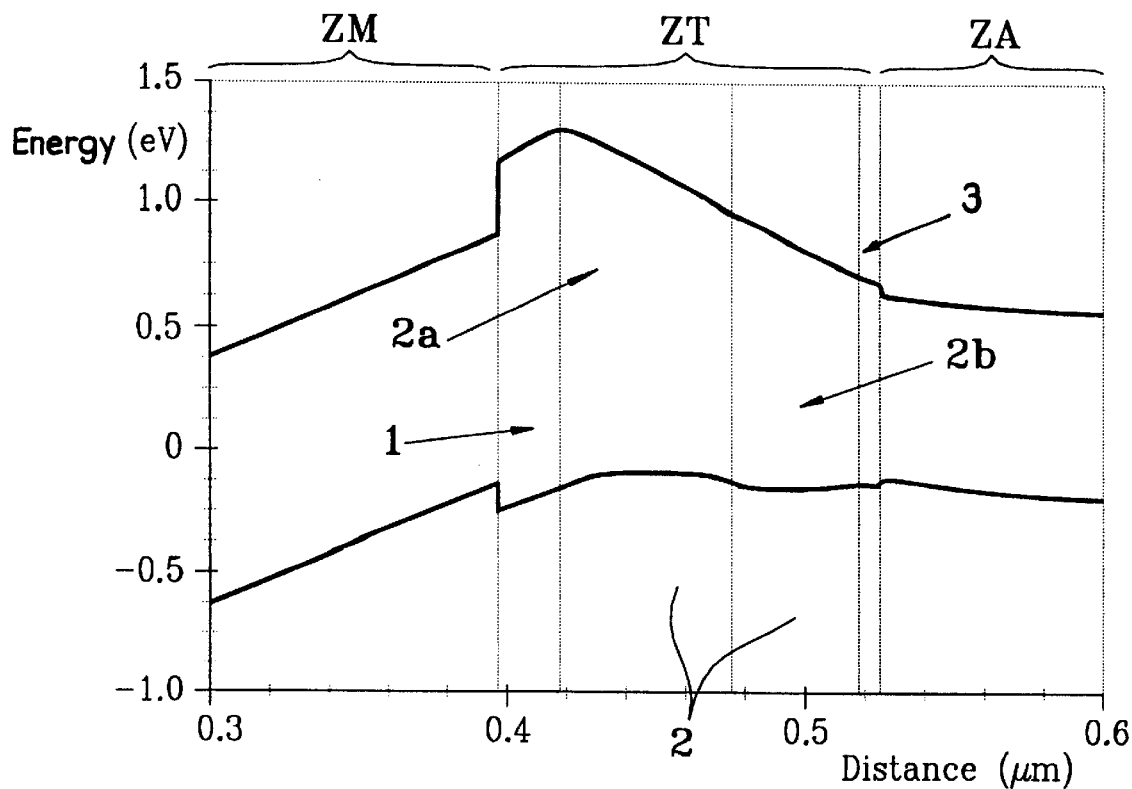
FIG. 2 is a graph showing the energy levels of the conduction and valence bands in the vicinity of the transition zone for a photodiode constituting a possible embodiment of the invention, the photodiode not being subjected to bias.
Figure 3:
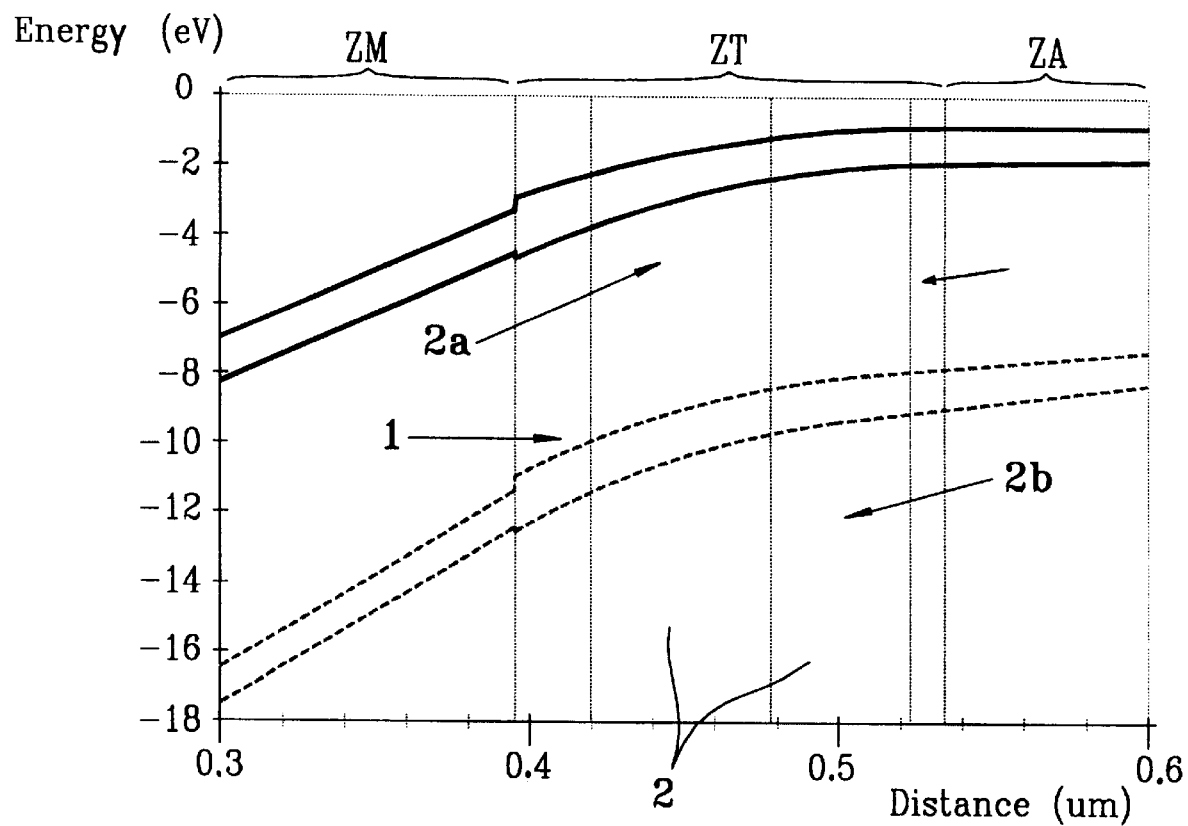
FIG. 3 is a graph analogous to that of FIG. 2, showing the energy levels of the conduction and valence bands for the same photodiode when biased at 14 volts and at 25 volts.

Reference is made to FIGS. 2 and 3 which show the energies of the conduction and valence bands for a photodiode constituting one possible embodiment of the invention.

The photodiode has a multiplication zone ZM, an absorption zone ZA, and a transition zone ZT disposed between the zones ZA and ZM.

Advantageously, the avalanche zone ZM has a multiple quantum well structure, thereby making it possible to take advantage of a large $\alpha/\beta$ ratio. In FIGS. 2 and 3, the energy bands shown are, in this case, equivalent energy bands.

The transition zone ZT, going from the multiplication zone ZM towards the absorption zone ZA, presents:

a non-doped zone 1 of a material having uniform composition;

a zone 2 of a material having graded composition, constituted by a first portion 2a having p type doping and a second portion 2b with no doping; and a plane of p type doping, given reference 3 in the figures.

The non-doped zone 1 is optional. It makes it possible to avoid dopants diffusing into the zones that are supposed to retain residual doping, and to separate in space the charge of the absorption region from the charge of the multiplication region.

The graded composition presented by the zone 2 makes it possible to pass in substantially continuous manner from the energy of the forbidden band of the absorption zone to that of the avalanche zone, such that the photodiode presents acceptable band discontinuities only (ideally none). This is shown in FIG. 3, where the conduction and valence bands are represented under bias of 14 volts (continuous lines) and of 25 volts (dashed lines).

The doping of the zone 2a makes it possible to incorporate an electric charge in the transition zone ZT as is necessary at the looked-for electric field values.

The function of the doping plane 3 is to retard extension of the space charge zone in the absorption zone, thereby making it possible to avoid the reverse electric field that is intrinsic to having a graded zone. Its thickness and doping level, i.e. charge, depend on the capabilities of the growth technique used.

With such a structure, biasing the device causes the conduction band of the graded composition portion to be flattened before the field extends into the absorption zone. The charge present in the doping plane 3 must be adjusted as a function of the structure, and in particular as a function of the length of the graded zone.

It will be observed that the above-described structure is particularly well adapted to the case of an avalanche medium into which electrons are injected coming from the absorption zone. Nevertheless, a symmetrical configuration makes it possible to obtain the device where it is holes that initiate the multiplication phenomenon.

The material of the zone 2 may be graded in part only (e.g. over the range 10% to 90%). Under such circumstances, small band discontinuities remain.

In a variant, it may be totally graded (over the range 0% to 100%).

Figure 4:
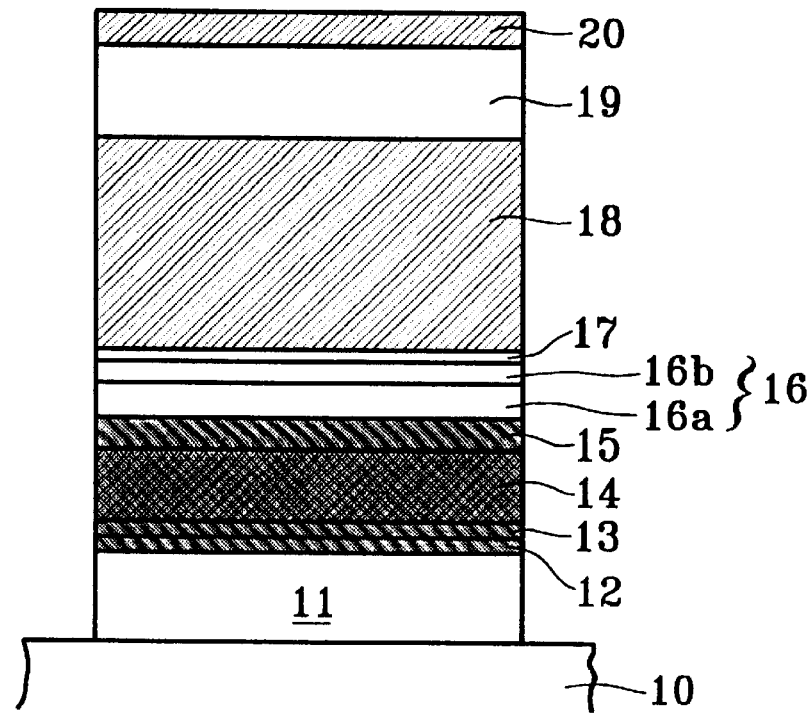
FIG. 4 is a diagram showing the structure of a quantum well avalanche photodiode of the invention.

A detailed structure for an avalanche photodiode of the invention is shown in FIG. 4.

This structure comprises an n+ doped InP substrate 10 on which a stack is deposited, constituted by the following different layers in succession:

a 5000 Å thick layer 11 of silicon n+ doped GaAsInAs (Q50);

a 200 Å thick silicon n+ doped layer 12 of AlInAs;

a 300 Å thick layer 13 (n–) of AlInAs;

a layer 14 (n–) of multiple quantum wells constituted by alternating layers of AlInAs and of GaAlInAs T(Q30), with the total thickness of this multiple quantum well layer being 2500 Å, the thickness of the layers of AlInAs being 150 Å and that of the layers of GaAlInAs being 100 Å;

a 200 Å thick layer 15 (n–) of AlInAs;

a graded layer 16 having a first portion 16a of thickness 600 Å which is p doped using beryllium (in the range 3.4 to $5 \times 10^{17}$ cm$^{-3}$, depending on the embodiment) and a second portion 16b is of n– type having a thickness of 400 Å and not doped, said layer 16 being made of a material of graded composition $(InAsAl)_{0.1}$ $(InGaAs)_{0.9}$ to $(InAlAs)_{0.9}$ $(InGaAs)_{0.1}$ (from 10% to 90%);

a 100 Å thick layer 17 $(InAlAs)_{0.1}$ $(InGaAs)_{0.9}$ doped with beryllium ($5 \times 10^{17}$ cm$^{-3}$);

a 1 μm n– type layer 18 of GaInAs;

a 500 Å thick zinc p+ doped layer 19 of GaAlInAs (Q50); and a 300 Å thick zinc p+ doped layer 20 of GaInAs.

The layers 11 and 12 deposited on the substrate 10 define a neural layer thereon.

The layers 11 and 12 constitute a neutral n+ doped layer interposed between the substrate 10 and the avalanche zone ZM.

The layers 13 to 15 constitute the avalanche zone ZM, the layer 15 being an interposed non-doped layer for separating in space the multiple quantum well layer 14 which constitutes the multiplication zone from the doped layer of the transition zone.

The transition zone is constituted by the layers 16a, 16b, and 17, the layer 17 defining the doping plane of the transition zone.

The layer 18 constitutes the absorption zone.

The layer 19 constitutes an intermediate layer S, with the layer 20 constituting a protective layer CP.

The structure described above constitutes a multiple quantum well avalanche photodiode for a system of AlInGaAs material having crystal lattice matching on InP.

This photodiode is advantageously used for digital optical transmission applications at a rate of 10 Gigabits/second at a wavelength of 1.55 μm.

Naturally, the invention is not limited to this type of material and can be applied whatever the nature of the absorption and avalanche regions, and whatever the system of materials used (AlGaInAsP family with or without lattice matching on conductive or semi-insulating InP or GaAs, II–VI materials, etc. . . . ). All that is necessary is obtaining grading with the growth means used (vapor organo-metallic vapor, molecular beams using solid or gaseous sources, chemical beams, . . . ).

We claim:

1. An avalanche photodiode having an absorption zone, a multiplication zone, and a transition zone disposed between the absorption zone and the multiplication zone, the transition zone being doped and being constituted at least in part by a material of composition that is graded such that the energy bands of the structure are substantially continuous when it is biased, wherein said doping is distributed non-uniformly in said graded composition zone so as to compensate, at least in part, the reverse electric field due to the composition grading of the material in the transition zone.

2. A photodiode according to claim 1, wherein the portion of graded composition material in the transition zone has a non-doped portion and a doped portion which carries the charge doping.

3. A photodiode according to claim 2, wherein a doping plane is juxtaposed with the non-doped portion on its side remote from the charge doping.

4. A photodiode according to claim 3, wherein the doping plane separates the absorption zone from the non-doped zone of the graded composition portion.

5. A photodiode according to claim 3, wherein the doped portion of the graded composition portion is separated from the multiplication zone by a non-doped intermediate zone.

6. A photodiode according to claim 1, wherein at least a portion of the multiplication zone is constituted by a stack having multiple quantum wells.

7. A photodiode according to claim 1, wherein the graded composition of the transition zone is totally graded.

8. A photodiode according to claim 1, wherein the graded composition of the transition zone is graded in part only.

9. A photodiode according to claim 1, made mainly of III–V semiconductor materials.

\* \* \* \* \*

UNITED STATES PATENT AND TRADEMARK OFFICE
CERTIFICATE OF CORRECTION

PATENT NO. : 5,912,478
DATED : June 15, 1999
INVENTOR(S) : Barrou et al.

It is certified that error appears in the above-identified patent and that said Letters Patent is hereby corrected as shown below:

On the title page

The correct first name of the second inventor is <u>André</u> SCAVENNEC.

The correct number of the French Patent is <u>9 6</u> 14521.

The correct name of the Primary Examiner is <u>Minhloan</u> Tran.

Signed and Sealed this

Seventeenth Day of April, 2001

NICHOLAS P. GODICI

*Attest:*

*Attesting Officer*     *Acting Director of the United States Patent and Trademark Office*